US010867876B2

(12) United States Patent
Kaji et al.

(10) Patent No.: US 10,867,876 B2
(45) Date of Patent: Dec. 15, 2020

(54) METHOD FOR MANUFACTURING SEMICONDUCTOR DEVICE

(71) Applicant: DENSO CORPORATION, Kariya (JP)

(72) Inventors: Aiko Kaji, Kariya (JP); Yoshiaki Yamanouchi, Kariya (JP); Jun Saito, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/750,286

(22) Filed: Jan. 23, 2020

(65) Prior Publication Data

US 2020/0243404 A1 Jul. 30, 2020

(30) Foreign Application Priority Data

Jan. 28, 2019 (JP) .................. 2019-012267

(51) Int. Cl.
| | |
|---|---|
| *H01L 21/306* | (2006.01) |
| *H01L 21/66* | (2006.01) |
| *H01L 21/3065* | (2006.01) |
| *H01L 29/66* | (2006.01) |
| *H01L 29/36* | (2006.01) |

(52) U.S. Cl.
CPC .......... *H01L 22/26* (2013.01); *H01L 21/3065* (2013.01); *H01L 29/36* (2013.01); *H01L 29/66704* (2013.01)

(58) Field of Classification Search
USPC .......................................... 216/60
See application file for complete search history.

(56) References Cited

U.S. PATENT DOCUMENTS 6,344,364 B1 * 2/2002 Gilton ................. H01L 22/26
216/60
2017/0110545 A1 4/2017 Nagao et al.
2018/0149809 A1 5/2018 Tsuji

FOREIGN PATENT DOCUMENTS

JP 2018-016300 A 2/2018

* cited by examiner

*Primary Examiner* — Roberts P Culbert
(74) *Attorney, Agent, or Firm* — Posz Law Group, PLC

(57) ABSTRACT

A manufacturing method of a semiconductor device includes: forming a second conductive type layer over a first conductive type layer; and forming a trench by etching the second conductivity type layer by a plasma etching process to expose the first conductivity type layer. The etching of the second conductivity type layer includes: performing a spectroscopic analysis of light emission of plasma; detecting an interface between the first conductivity type layer and the second conductivity type layer based on a change in emission intensity; and stopping the etching of the second conductivity type layer when an end point is determined based on a detection result of the interface.

6 Claims, 12 Drawing Sheets

METHOD FOR MANUFACTURING SEMICONDUCTOR DEVICE

CROSS REFERENCE TO RELATED APPLICATION

The present application claims the benefit of priority from Japanese Patent Application No. 2019-12267 filed on Jan. 28, 2019. The entire disclosure of the above application is incorporated herein by reference.

TECHNICAL FIELD

The present disclosure relates to a manufacturing method for a semiconductor device.

BACKGROUND

Conventionally, a semiconductor device having a MOS structure semiconductor element has been proposed. For example, as a semiconductor element having a MOS structure, there is a MOSFET having a trench gate structure in which a channel density is increased so that a large current can flow. This MOSFET has a structure such that a p type base region and an n type source region are sequentially formed on an n type drift layer formed on an $n^+$ type substrate, and multiple trench gate structures are formed to penetrate the p type base region from the surface of the n type source region and to reach the n type drift layer.

SUMMARY

According to an example, a manufacturing method of a semiconductor device includes: forming a second conductive type layer over a first conductive type layer; and forming a trench by etching the second conductivity type layer by a plasma etching process to expose the first conductivity type layer. The etching of the second conductivity type layer includes: performing a spectroscopic analysis of light emission of plasma; detecting an interface between the first conductivity type layer and the second conductivity type layer based on a change in emission intensity; and stopping the etching of the second conductivity type layer when an end point is determined based on a detection result of the interface.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
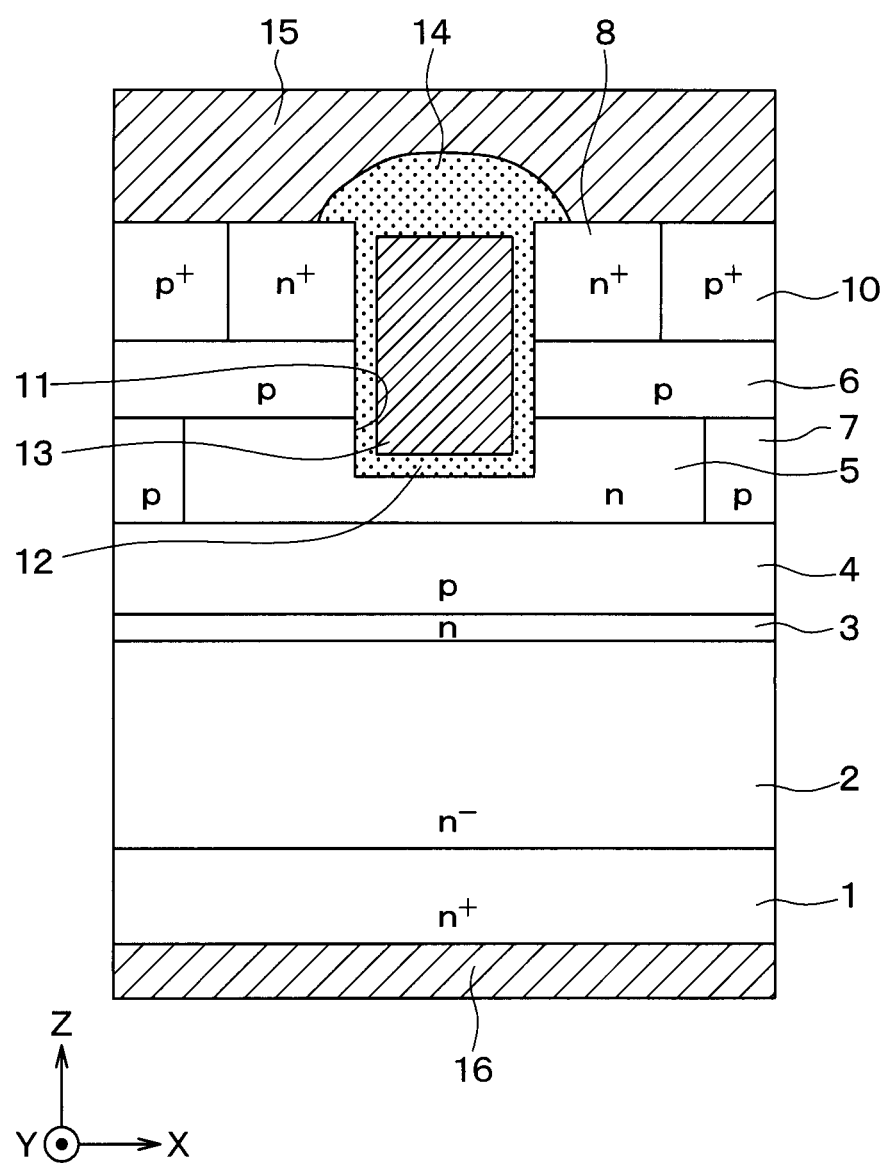
FIG. 1 is a cross-sectional view of a SiC semiconductor device according to a first embodiment.

The following embodiments relate to a semiconductor device having a MOS structure semiconductor element, and is particularly suitable when applied to a SiC semiconductor device made of silicon carbide (hereinafter referred to as SiC) as a semiconductor material.

In a trench gate structure, a gate trench is formed such that the trench reaches the n type drift layer through the p type base region from the surface of the n type source region, and then a gate electrode is formed in the gate trench via a gate insulation film. When forming the gate trench, it is desirable to make the amount of protrusion of the gate trench from the p type base region constant so that the semiconductor device has desired characteristics. For this reason, the etching depth from the surface of the n type source region is adjusted by the etching time or the like to control the gate trench to have a constant depth.

When a p type base region or an n type source region is formed by ion-implanting a p type impurity or an n type impurity into the n type drift layer, the ion implantation depth can be controlled with high accuracy. And therefore, the thickness of the p type base region or the n type source region can be made constant. For this reason, at the time of forming the gate trench, by adjusting the etching time and the like, the gate trench has a constant depth, and the protrusion amount of the gate trench from the p type base region can be made constant.

However, when the p type base region and the n type source region are formed by epitaxial growth on the n type drift layer, the thickness of the p type base region and the thickness of the n type source region cannot be made constant because the amount of epitaxial growth varies. For this reason, the amount of protrusion of the gate trench from the p type base region cannot be made constant only by adjusting the etching time or the like when forming the gate trench, although the depth of the gate trench can be made constant.

In order to make the protrusion amount of the gate trench from the p type base region constant, it is necessary to detect the boundary between the p type base region and the n type drift layer with high accuracy. However, it is difficult to detect the boundary between same semiconductor materials.

Here, the formation of the gate trench in the trench gate structure has been described as an example. In addition, in the structure in which a plurality of conductive type layers made of the same kind of semiconductor material are stacked, it is difficult to detect the boundary between the conductive type layers when the trench is formed.

In view of the above points, a method for manufacturing a semiconductor device is provided such that a boundary between conductive layers is accurately detected to perform an etching stop when forming a trench in a structure in which a plurality of conductive layers made of the same type of semiconductor materials are stacked.

In order to achieve the above object, in the method for manufacturing a semiconductor device, a trench is formed by etching to penetrate a second conductive type layer and to expose a first conductive type layer in a stacking structure in which the second conductive type layer made of the same type of the semiconductor material as the first conductivity type layer is formed on at least the first conductivity type layer. In such a method of manufacturing a semiconductor device, the method includes: forming a second conductive type layer on the first conductive type layer by epitaxial growth; and performing an etching step by a plasma etching process. Spectral analysis of light emission in plasma generated during the plasma etching process is performed using a plasma spectrometer. The interface between the first conductivity type layer and the second conductivity type layer is detected based on the change in the emission intensity of at least one of an additive disposed in the first conductivity type layer and an additive disposed in the second conductivity type layer at an any wavelength. The etching process is stopped by detecting the end point based on the detection result.

As described above, at the time of etching, the interface between a plurality of different conductivity type layers made of the same kind of semiconductor material is detected from the change in the light emission of the element as an additive. Thereby, since the interface can be detected, the end point of the trench etching stop can be accurately detected. Therefore, it is possible to provide a method for manufacturing a semiconductor device with accurately detecting an interface between conductive type layers and performing the etching stop.

Hereinafter, embodiments of the present disclosure will be described with reference to the drawings. In the following embodiments, the same or equivalent parts are denoted by the same reference numerals.

First Embodiment

A first embodiment will be described. In the present embodiment, an SiC semiconductor device using SiC as a semiconductor material will be described as an example. The SiC semiconductor device of the present embodiment is prepared by forming an inverted vertical MOSFET having a trench gate structure shown in FIGS. 1 and 2 as a semiconductor element. The vertical MOSFET shown in these drawings is formed in a cell region of the SiC semiconductor device, and the SiC semiconductor device is configured by forming an outer peripheral withstand voltage structure so as to surround the cell area. Here, only the vertical MOSFET is illustrated in the drawings. In the following, as shown in FIGS. 1 and 2, the width direction of the vertical MOSFET is defined as the X direction, the depth direction of the vertical MOSFET intersecting the X direction is defined as the Y direction, and the thickness direction or the depth direction of the vertical MOSFET that is the normal direction to the XY plane will be described as the Z direction.

Figure 2:
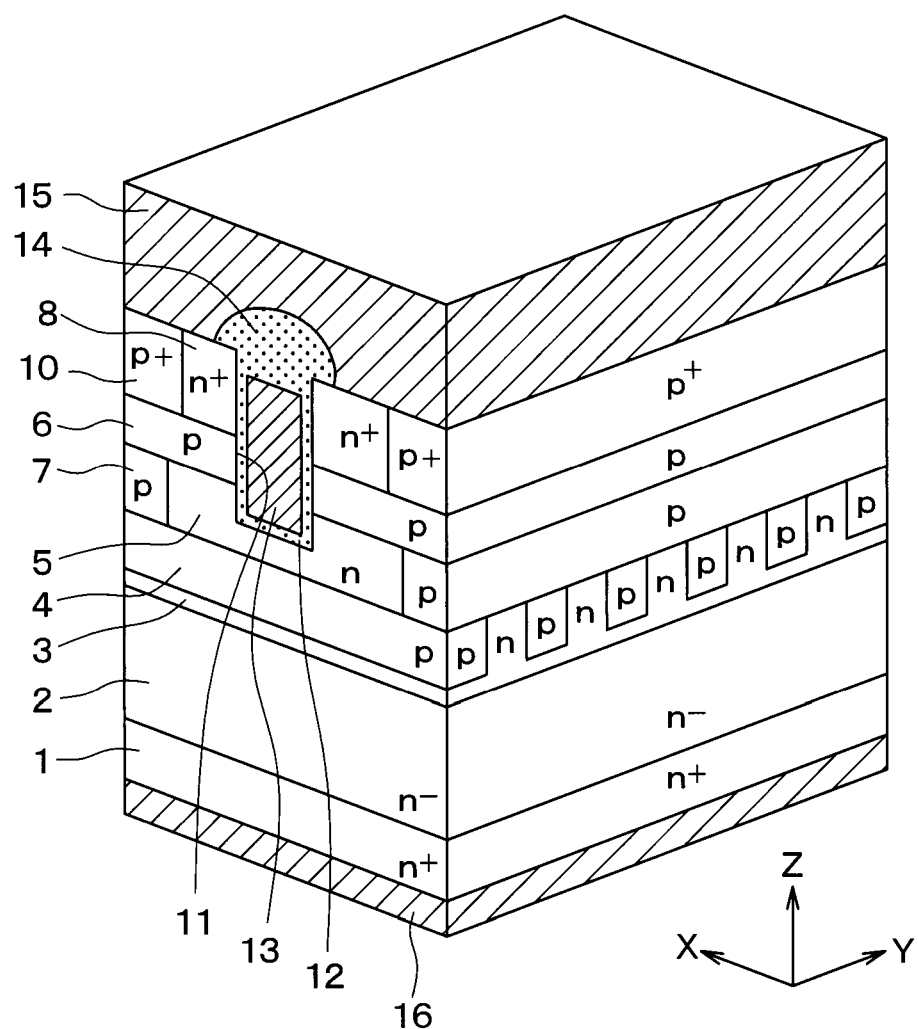
FIG. 2 is a perspective cross-sectional view showing a part of the SiC semiconductor device shown in FIG. 1.

As shown in FIGS. 1 and 2, in an SiC semiconductor device, an n$^+$ type substrate 1 made of SiC is used as a semiconductor substrate. An n$^-$ type layer 2 made of SiC is formed on the main surface of n$^+$ type substrate 1. The surface of the n$^+$ type substrate 1 is a (0001) Si surface, for example, the n type impurity concentration is $5.9\times10^{18}/cm^3$, and the thickness is 100 μm. For example, the n$^-$ type layer 2 has an n type impurity concentration of $7.0\times10^{15}$ to $1.0\times10^{16}/cm^3$, and a thickness of 8.0 μm.

A JFET portion 3 made of SiC and an electric field blocking layer 4 are formed on the n$^-$ type layer 2, and the n$^-$ type layer 2 is connected to the JFET portion 3 at a position spaced away from the n$^+$ type substrate 1.

The JFET portion 3 and the electric field blocking layer 4 constitute a saturation current suppressing layer, and both of the portion 3 and the layer 4 extend in the X direction and are alternately arranged in the Y direction. That is, when viewed from the normal direction with respect to the main surface of the n$^+$ type substrate 1, at least a part of the JFET portion 3 and the electric field blocking layer 4 are each formed into a plurality of strip lines, that is, stripes, and are alternately arranged.

In the present embodiment, the JFET portion 3 is formed below the electric field blocking layer 4. For this reason, the striped portions of the JFET portion 3 are connected to each other below the electric field block layer 4, but each of the striped portions is interposed between the plurality of electric field block layers 4.

Each striped portion of the JFET portion 3 that provides a stripe line, that is, each stripe-shaped portion, has a width of, for example, 0.25 μm and a pitch that is a formation interval of, for example, 0.6 to 2.0 μm. The thickness of the JFET portion 3 is 1.5 μm, for example, and the n type impurity concentration is higher than that of the n type layer 2, and is, for example, $5.0\times10^{17}$ to $2.0\times10^{18}/cm^3$.

The electric field blocking layer 4 is a portion constituting a lower portion that provides a part of the electric field relaxation layer, and is constituted by a p type impurity layer. As described above, the electric field blocking layer 4 has a stripe shape, and each strip-like portion of the stripe shaped electric field blocking layer 4 has a width of, for example, 0.15 μm and a thickness of, for example, 1.4 μm. The electric field blocking layer 4 has a p type impurity concentration of, for example, $3.0\times10^{17}$ to $1.0\times10^{18}/cm^3$. In the present embodiment, the electric field blocking layer 4 has a constant p type impurity concentration in the depth direction. The electric field blocking layer 4 has a surface opposite to the n$^-$ type layer 2 that is disposed on the same plane as the surface of the JFET portion 3.

Further, an n type current dispersion layer 5 made of SiC is formed on the JFET portion 3 and the electric field blocking layer 4. The n type current dispersion layer 5 is a layer for diffusing a current flowing through the channel in the X direction, as will be described later. For example, the n type impurity concentration thereof is higher than that of the n⁻ type layer 2. In the present embodiment, the n type current dispersion layer 5 extends along the Y direction as the longitudinal direction, and the n type impurity concentration is the same as or higher than that of the JFET portion 3, and the thickness is, for example, 0.5 μm. The n type current dispersion layer 5 has an n type impurity concentration of $2.0 \times 10^{16}$ to $5.0 \times 10^{17}/cm^3$.

Here, for the sake of convenience, the drift layer is described as being divided into an n type layer 2, a JFET portion 3, and an n type current dispersion layer 5, but these are portions that constitute the drift layer, and these are connected to each other.

A p type base region 6 made of SiC is formed on the n type current dispersion layer 5. Further, the p type deep layer 7 is formed below the p type base region 6, specifically, in a portion between the surface of the JFET portion 3 and the electric field blocking layer 4 and the p type base region 6 where the n type current dispersion layer 5 is not formed. The p type deep layer 7 is a part constituting an upper part of the electric field relaxation layer. In the present embodiment, the p type deep layer 7 extends along the direction intersecting with the longitudinal direction of the stripe-shaped portion of the JFET portion 3 and the electric field blocking layer 4, which is defined as the Y direction as the longitudinal direction. A plurality of the deep layers 7 and the n type current dispersion layers 5 are alternately arranged in the X direction. The p type base region 6 and the electric field blocking layer 4 are electrically connected through the p type deep layer 7. The formation pitch of the n type current dispersion layer 5 and the p type deep layer 7 corresponds to the formation pitch of a trench gate structure described later.

Furthermore, an n type source region 8 is formed on the p type base region 6. The n type source region 8 is formed in a portion of the p type base region 6 corresponding to a later-described trench gate structure, and is formed on both sides of the trench gate structure.

The p type base region 6 is thinner than the electric field blocking layer 4 and has a low p type impurity concentration. For example, the p type impurity concentration is $3 \times 10^{17}/cm^3$ and the thickness is 0.4 to 0.6 μm. The p type deep layer 7 has the same thickness as that of the n type current dispersion layer 5 and the p type impurity concentration may be any value. For example, the thickness thereof is equal to the electric field blocking layer 4.

The n type source region 8 is a region for contacting with a source electrode 15 described later, and the n type impurity thereof has a high concentration. For example, the n type source region 8 has an n type impurity concentration of $1.0 \times 10^{18}$ to $5.0 \times 10^{19}/cm^3$ and a thickness of 0.3 to 0.7 μm.

Further, the p type connection layer 10 is formed at a position on the p type base region 6 corresponding to the p type deep layer 7, in other words, the position different from the n type source region 8 and opposite to the trench gate structure across the n type source region 8. The p type connection layer 10 is a layer for electrically connecting the p type base region 6 and a source electrode 15 described later by coupling them.

The p type connection layer 10 is a portion that contacts with the source electrode 15 as a contact region. For example, the p type connection layer 10 has a p type impurity concentration set to be a high concentration in a range between $2.0 \times 10^{18}$ to $1.0 \times 10^{20}/cm^3$ and a thickness of 0.2 to 0.3 μm.

Further, for example, the gate trench 11 is formed to have the width of 0.4 μm and the depth deeper by 0.2 to 0.4 μm than the total film thickness of the p type base region 6 and the n type source region 8 so as to penetrate the n type source region 8 and the p type base region 6 and to reach the n type current dispersion layer 5. The above described p type base region 6 and n type source region 8 are arranged so as to be in contact with the side surface of the gate trench 11. The gate trench 11 has a stripe-like layout with the X direction in FIG. 2 defined as the width direction, the direction intersecting the longitudinal direction of the JFET portion 3 and the electric field blocking layer 4, which is defined as the Y direction as the longitudinal direction, and the Z direction as the depth direction. The plurality of gate trenches 11 are in the form of stripe lines arranged at equal intervals in the X direction, and the p type base region 6 and the n type source region 8 are arranged therebetween. In addition, a p type deep layer 7 and a p type connection layer 10 are disposed at an intermediate position of each gate trench 11.

At the side surface of the gate trench 11, the p type base region 6 provides a channel region that connects the n type source region 8 and the n type current dispersion layer 5 when the vertical MOSFET is operated. The inner wall surface of the gate trench 11 including the channel region is covered with a gate insulation film 12. A gate electrode 13 made of doped Poly-Si is formed on the surface of the gate insulation film 12, and the gate trench 11 is completely filled with the gate insulation film 12 and the gate electrode 13, thereby forming a trench gate structure.

A source electrode 15 and a gate wiring layer (not shown) are formed on the surface of the n type source region 8 and the surface of the gate electrode 13 via an interlayer insulation film 14. The source electrode 15 and the gate wire layer are made of a plurality of metals such as Ni/Al. At least a portion of the metals being in contact with n type SiC, specifically, the n type source region 8, is made of a metal capable of ohmic contact with the n type SiC. In addition, at least a portion in contact with p type SiC among the plurality of metals, specifically, in contact with the p type connection layer 10, is made of a metal capable of ohmic contact with the p type SiC. Note that the source electrode 15 is formed on the interlayer insulation film 14 and is electrically insulated from the SiC portion. The source electrode 15 is electrically connected to the n type source region 8 and the p type connection layer 10 via a contact hole formed in the interlayer insulation film 14. Since the p type base region 6, the p type deep layer 7 and the electric field blocking layer 4 are connected through the p type connection layer 10, all of these are set to be the source potential.

Further, a drain electrode 16 electrically connected to the n⁺ type substrate 1 is formed on a back surface of the n⁺ type substrate 1. The structure described above configures an n-channel type inverted vertical MOSFET with a trench gate structure. A cell region is formed by arranging multiple cells of the vertical MOSFET described above. The SiC semiconductor device is formed by configuring an outer peripheral withstand voltage structure with a guard ring (not shown) or the like so as to surround the cell region in which the vertical MOSFETs described above are formed.

The SiC semiconductor device having the vertical MOSFETs configured as described above is operated, for example, by applying a gate voltage Vg of 20 V to the gate electrode 13 in a state where a source voltage Vs is 0 V and a drain voltage Vd is 1 V to 1.5 V. That is, the vertical MOSFET provides a channel region in the p type base region 6 in contact with the gate trench 11 when the gate voltage Vg is applied. Thereby, the n type source region 8 and the n type current dispersion layer 5 are electrically conducted. Therefore, the vertical MOSFET turns on, and performs an operation for passing a current between the drain and the source from the $n^+$ type substrate 1 through the drift layer including the $n^-$ type layer 2, the JFET portion 3 and the n type current dispersion layer 5, and further from the channel region through the n type source region 8. Further, by stopping the application to the gate voltage Vg, the channel region disappears, so that the conduction between the n type source region 8 and the n type current dispersion layer 5 is cut. Thus, the vertical MOSFET turns off, and the current between the drain and the source stops flowing.

Further, the SiC semiconductor device of this embodiment includes a JFET portion 3 and an electric field blocking layer 4. For this reason, when the vertical MOSFET is operated, the JFET portion 3 and the electric field blocking layer 4 function as a saturation current suppression layer, and a low on-state resistance can be achieved by the saturation current suppression effect and a low saturation current is maintained. Specifically, since the striped portions of the JFET portion 3 and the electric field blocking layer 4 are alternately and repeatedly formed, the following operation is performed.

First, when the drain voltage Vd is a voltage to be applied during normal operation such as 1 to 1.5 V, for example, the depletion layer extends from the electric field blocking layer 4 side to the JFET portion 3 with a width smaller than the width of the stripe pattern in the JFET portion 3. For this reason, even if the depletion layer extends into the JFET portion 3, a current path is secured. Since the n type impurity concentration of the JFET portion 3 is higher than that of the $n^-$ type layer 2 and the current path can be configured with a low resistance, a low on-state resistance can be achieved.

Further, when the drain voltage Vd becomes higher than the voltage during normal operation due to a load short circuit or the like, the depletion layer extending from the electric field blocking layer 4 side to the JFET portion 3 extends beyond the width of the striped portion of the JFET portion 3. Then, the JFET portion 3 is immediately pinched off before the n type current dispersion layer 5 pinched off. At this time, the relationship between the drain voltage Vd and the width of the depletion layer is determined based on the width of the striped portion of the JFET portion 3 and the n type impurity concentration. For this reason, the width of the striped portion and the n type impurity concentration of the JFET portion 3 are set so that the JFET portion 3 is pinched off when the voltage becomes slightly higher than the drain voltage Vd in the normal operation. Therefore, the JFET section 3 can be pinched off even with a low drain voltage Vd. In this way, when the drain voltage Vd becomes higher than the voltage in the normal operation, the JFET unit 3 is immediately pinched off, so that a low saturation current can be maintained, and further it is possible to improve the tolerance of the SiC semiconductor device due to a load short circuit or the like.

In this way, the JFET portion 3 and the electric field blocking layer 4 function as a saturation current suppression layer, and exhibit a saturation current suppression effect, thereby providing a SiC semiconductor device that can achieve both low on-state resistance and low saturation current.

Further, by providing the electric field block layer 4 so as to sandwich the JFET portion 3, the striped portion of the JFET portion 3 and the electric field block layer 4 are alternately and repeatedly formed. For this reason, even if the drain voltage Vd becomes a high voltage, the extension of the depletion layer extending from the bottom to the $n^-$ type layer 2 is suppressed by the electric field blocking layer 4 to prevent the depletion layer from extending into the trench gate structure. Therefore, an electric field suppression effect that lowers the electric field applied to the gate insulation film 12 can be exerted, and the gate insulation film 12 can be prevented from being broken, so that it is possible to obtain a highly reliable element with high breakdown voltage. Since the depletion layer can be prevented from extending to the trench gate structure in this way, the n type impurity concentration of the $n^-$ type layer 2 and the JFET portion 3 constituting a part of the drift layer can be made relatively high. It becomes possible to achieve a low on-state resistance.

Next, a method of manufacturing the SiC semiconductor device having the n channel type inverted vertical MOSFET with the trench gate structure according to the present embodiment will be described with reference to cross-sectional views during a manufacturing process shown in FIGS. 3A and 3G.

Figure 3A:
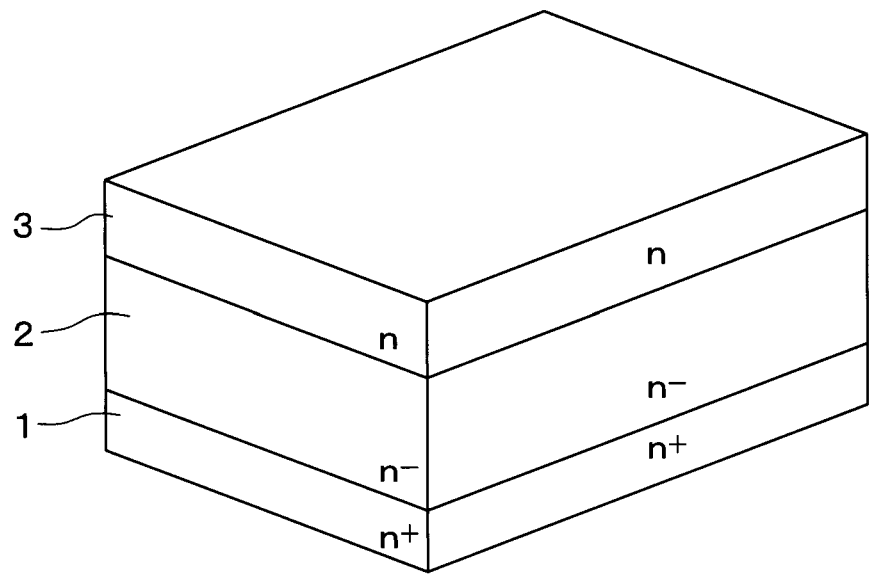
FIG. 3A is a perspective cross-sectional view showing a manufacturing process of the SiC semiconductor device shown in FIG. 1.

[Process Shown in FIG. 3A]

First, an $n^+$ type substrate 1 is prepared as a semiconductor substrate. Then, an $n^-$ type layer 2 made of SiC is formed on the main surface of the $n^+$ type substrate 1 by epitaxial growth using a CVD (chemical vapor deposition) apparatus (not shown).

At this time, a so-called epitaxial substrate in which the $n^-$ type layer 2 is preliminarily grown on the main surface of the $n^+$ type substrate 1 may be used. Then, a JFET portion 3 made of SiC is epitaxially grown on the $n^-$ type layer 2.

The epitaxial growth is performed by introducing a gas that includes, for example, nitrogen gas providing an n type dopant in addition to silane or propane that is a raw material gas of SiC.

Figure 3B:
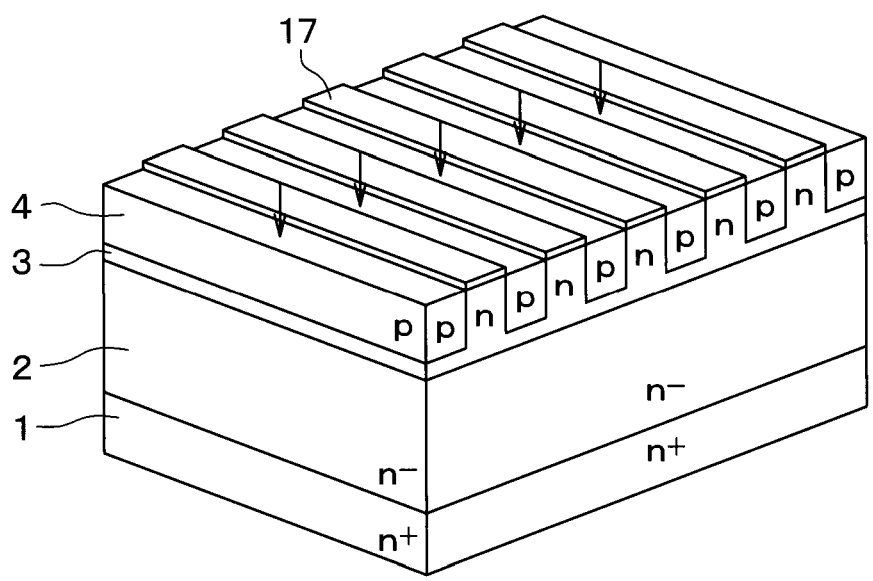
FIG. 3B is a perspective cross-sectional view showing a manufacturing process of the SiC semiconductor device continued from FIG. 3A.

[Process Shown in FIG. 3B]

After the mask 17 is arranged on the surface of the JFET portion 3, the mask 17 is patterned to open a region where the electric field blocking layer 4 is to be formed. Then, the electric field blocking layer 4 is formed by ion implantation of p type impurities. Thereafter, the mask is removed.

Here, the electric field blocking layer 4 is formed by the ion implantation. Alternatively, the electric field blocking layer 4 may be formed by a method other than the ion implantation. For example, the JFET portion 3 is selectively anisotropically etched to form a recess at a position corresponding to the electric field blocking layer 4, and after a p type impurity layer is epitaxially grown thereon, the p type impurity layer is planarized at the portion over the JFET 3 so that the electric field blocking layer 4 is formed. Thus, the electric field blocking layer 4 can also be formed by the epitaxial growth. When epitaxially growing p type SiC, a gas serving as a p type dopant such as trimethylaluminum (TMA) may be introduced in addition to the SiC raw material gas.

Figure 3C:
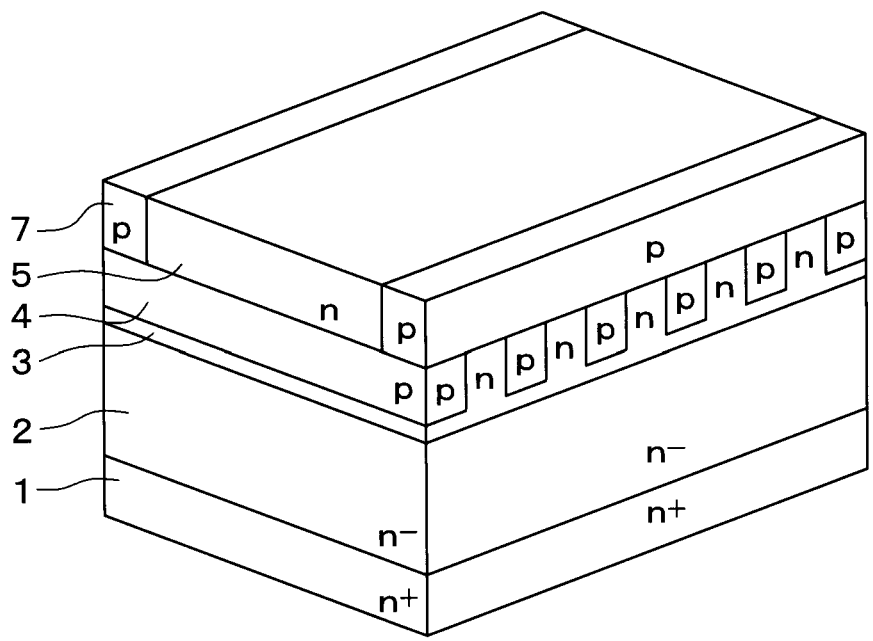
FIG. 3C is a perspective cross-sectional view showing a manufacturing process of the SiC semiconductor device continued from FIG. 3B.

[Process Shown in FIG. 3C]

Subsequently, n type SiC is epitaxially grown on the JFET portion 3 and the electric field blocking layer 4 to form the n type current dispersion layer 5. Then, on the n type current dispersion layer 5, a mask (not shown) with an opening at a position where the p type deep layer 7 is to be formed is arranged. Thereafter, a p type deep layer 7 is formed by the ion implantation of p type impurities from above the mask.

Alternatively, although the example which forms the p type deep layer 7 by the ion implantation is described, the layer 7 may also be formed by methods other than the ion implantation. For example, similarly to the electric field blocking layer 4, a recess is formed in the n type current dispersion layer 5, and then a p type impurity layer is epitaxially grown and further the p type impurity layer is flattened, thereby forming a p type deep layer 7. Alternatively, the n type current dispersion layer 5 may be formed by the ion implantation after the p type deep layer 7 is formed.

Figure 3D:
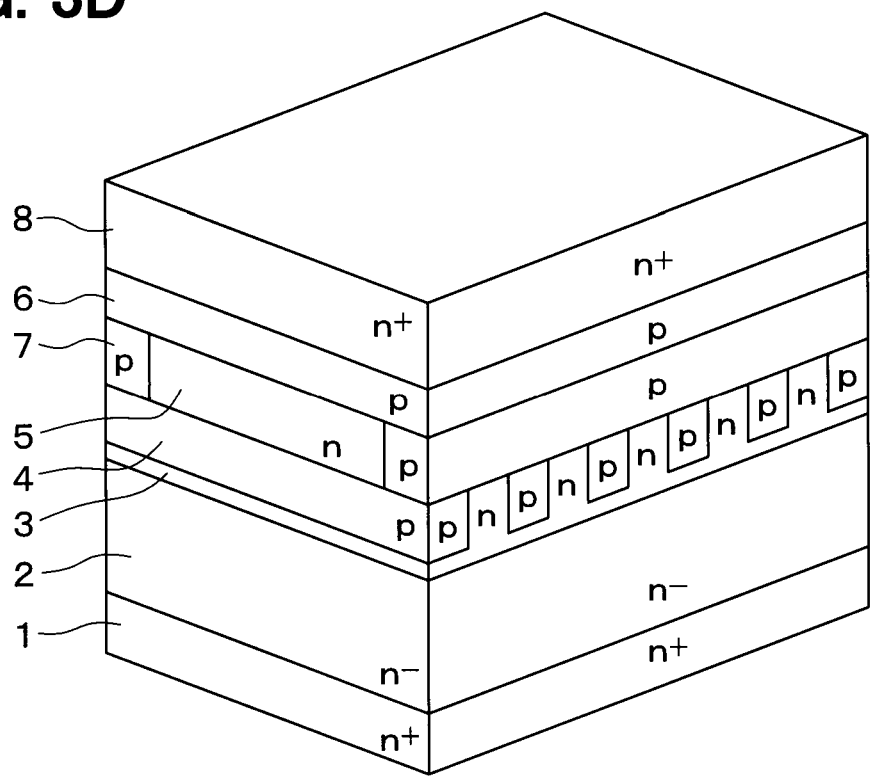
FIG. 3D is a perspective cross-sectional view showing a manufacturing process of the SiC semiconductor device continued from FIG. 3C.

[Process Shown in FIG. 3D]

A p type base region 6 and an n type source region 8 are epitaxially grown in this order on the n type current dispersion layer 5 and the p type deep layer 7 using a CVD apparatus (not shown). For example, in the same CVD apparatus, first, the p type deep layer 7 is formed by the epitaxial growth with introducing a gas serving as a p type dopant. Subsequently, after the introduction of the gas for the p type dopant is stopped, the n type source region 8 is formed by the epitaxial growth with introducing the gas that provides the n type dopant.

In this way, the p type base region 6 and the n type source region 8 can be formed with the above-described impurity concentration and the film thickness. Here, since the p type base region 6 and the n type source region 8 are formed by the epitaxial growth, although they can be formed with good film quality, the film thickness may vary to some extent.

Figure 3E:
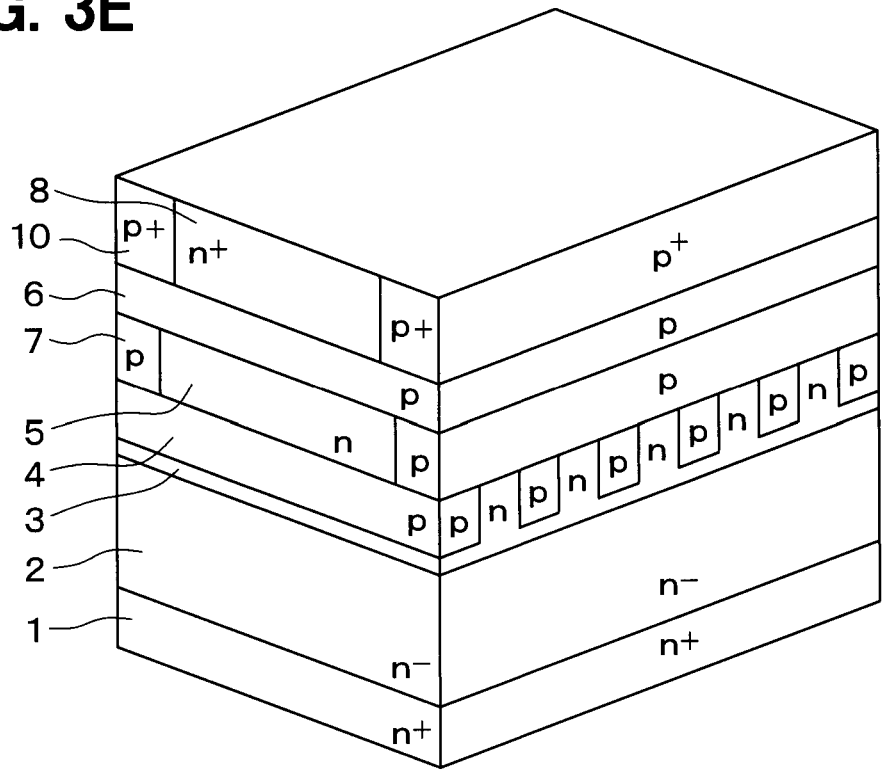
FIG. 3E is a perspective cross-sectional view showing a manufacturing process of the SiC semiconductor device continued from FIG. 3D.

[Process Shown in FIG. 3E]

On the n type source region 8, a mask (not shown) having an opening at a position where the p type connection layer 10 is to be formed is disposed. Then, after p type impurities are ion-implanted from above the mask, a heat treatment at 1500° C. or higher is performed for activation. As an element to be ion-implanted, one or both of boron (B) and aluminum (Al) are used. Thereby, the p type connection layer 10 can be formed by cancelling the n type source region 8 by the ion implantation of p type impurities.

Figure 3F:
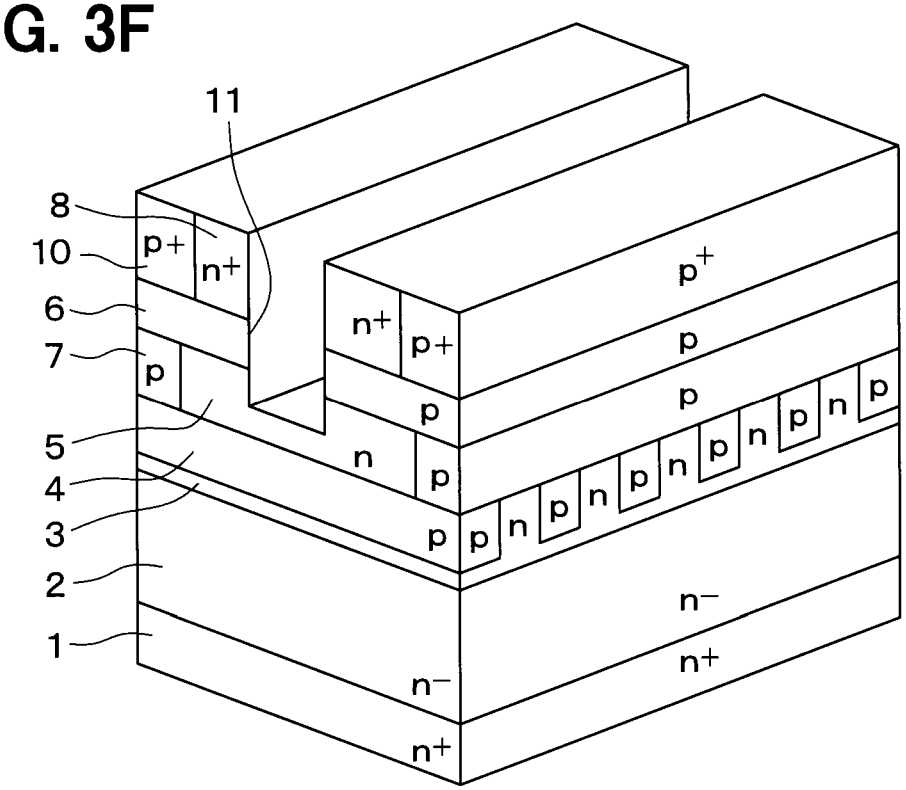
FIG. 3F is a perspective cross-sectional view showing a manufacturing process of the SiC semiconductor device continued from FIG. 3E.

[Process Shown in FIG. 3F]

Figure 4:
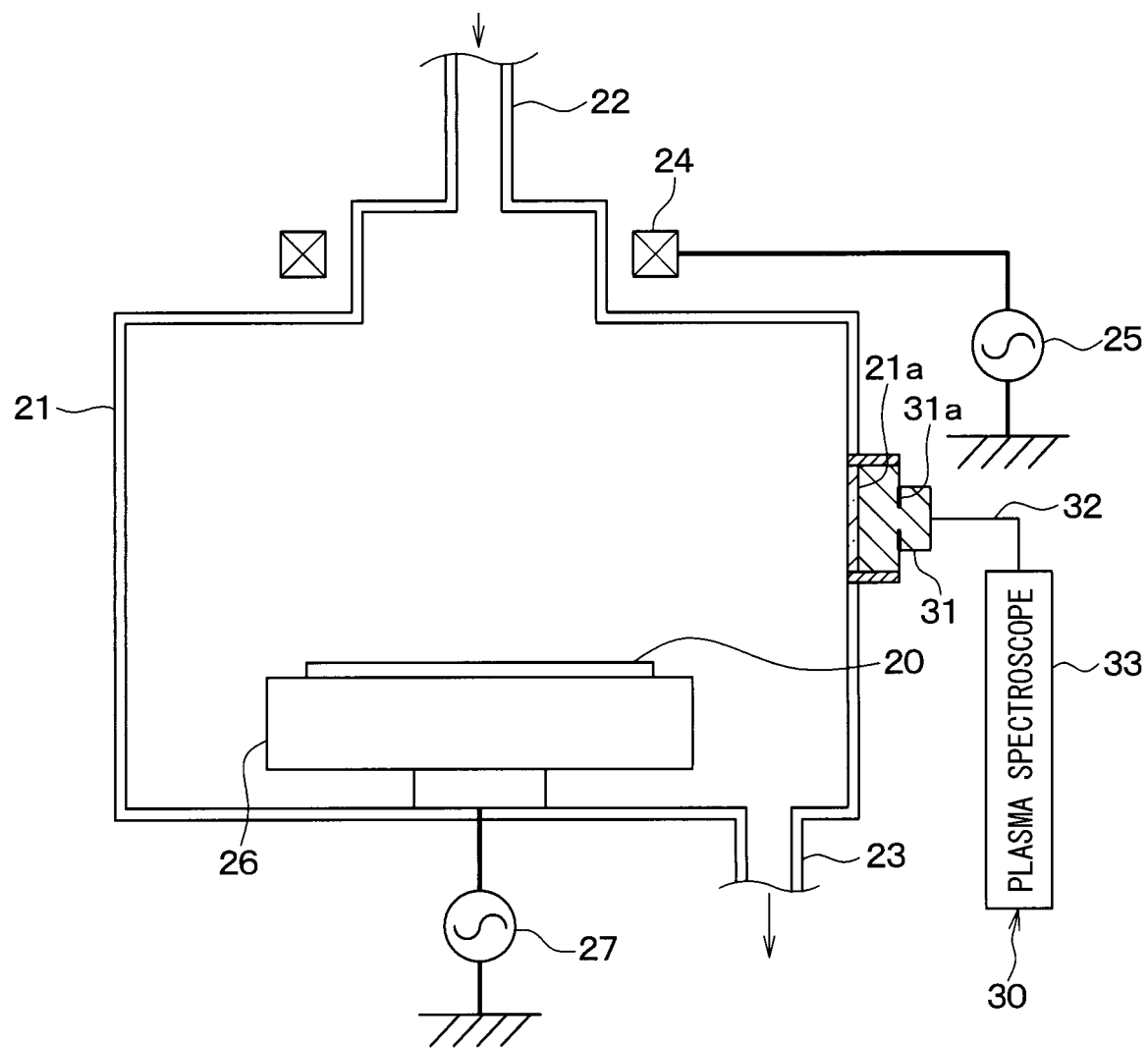
FIG. 4 is a schematic configuration diagram of a plasma etching apparatus and a plasma spectrometer.

A mask not shown is formed on the n type source region 8 and the like, and then a region of the mask where the gate trench 11 is to be formed is opened. Then, as shown in FIG. 4, the sample 20 subjected to the above steps is placed in a chamber 21 of a plasma etching apparatus, and anisotropic etching such as RIE (Reactive Ion Etching) is performed in a state of being covered with a mask. Thus, the gate trench 11 is formed. Note that although a description is given here of a capacitively coupled plasma type plasma etching apparatus, other types may be used.

As shown in FIG. 4, the etching apparatus includes a chamber 21. The chamber 21 constitutes a vacuum chamber and has a gas introduction port 22 and a gas exhaust port 23. Although not shown, the gas inlet 22 is connected to gas lines corresponding to the number of gas types to be introduced so that a plurality of types of gas can be introduced. For example, SF6 gas for etching is used as the gas type. And by controlling the switching valve of each gas line, a desired gas species can be introduced into the chamber 21 and the flow rate into the chamber 21 can be controlled.

The gas exhaust port 23 is provided with an exhaust valve (not shown) so that the pressure in the chamber 21 can be controlled to a desired value by controlling the exhaust valve and the switching valve provided in each gas line.

The chamber 21 is provided with an RF coil 24. The RF coil 24 generates an RF electric field in the chamber 21 by being supplied with electric power from a power source 25 for generating plasma.

The chamber 21 is provided with an installation table 26 on which the sample 20 to be etched is placed. The installation table 26 is connected to a power source 27 for a bias so that a predetermined bias can be applied to the sample 20.

Using such an etching apparatus, for example, an etching gas such as SF6 is introduced from the gas inlet 22, and the RF power in the etching apparatus is set to be 1200 W and the atmospheric pressure is set to be 0.5 Pa. As a result, plasma is generated in the space above the sample 20, whereby the portion of the sample 20 that is not covered with the mask is etched, and the gate trench 11 is formed.

At this time, the plasma spectrometer 30 is connected to the etching apparatus so that the state during the etching can be monitored by the plasma spectrometer 30. Then, the etching is stopped based on the result of spectral analysis by the plasma spectrometer 30.

Specifically, the chamber 21 is provided with a monitoring window 21a, and the light incident part 31 of the plasma spectrometer 30 is installed in the monitoring window 21a. As a result, light emitted from the elements included in the plasma is incident on the light incident part 31 from the monitoring window 21a. The opening width of the light incident part 31 is variable using the variable mechanism 31a. By changing the opening width, the amount of incident light can be adjusted, and the peak height of the waveform obtained by the spectroscopic analysis can be adjusted. Then, light is guided to the main body 33 of the plasma spectrometer 30 through the optical fiber 32 connected to the light incident part 31, and the spectroscopic analysis is performed in the main body 33.

Generally, the plasma spectrometer 30 is used for reading the interface of stacked films made of different materials, respectively. For example, as stacked films made of different materials, a structure in which a silicon oxide film is formed on a silicon layer may be used. In such a structure, 0% of oxygen is introduced into the silicon layer, and 66% of oxygen is introduced into the silicon oxide film. For this reason, when proceeding the etching step from the surface of the layer, and the interface between the silicon layer and the silicon oxide film is exposed, the silicon layer not including oxygen is switched to the silicon oxide film including the oxygen. Therefore, at the time of this switching time, a peak derived from the oxygen element appears in the waveform result of the spectral analysis by the plasma spectrometer 30.

Figure 5A:
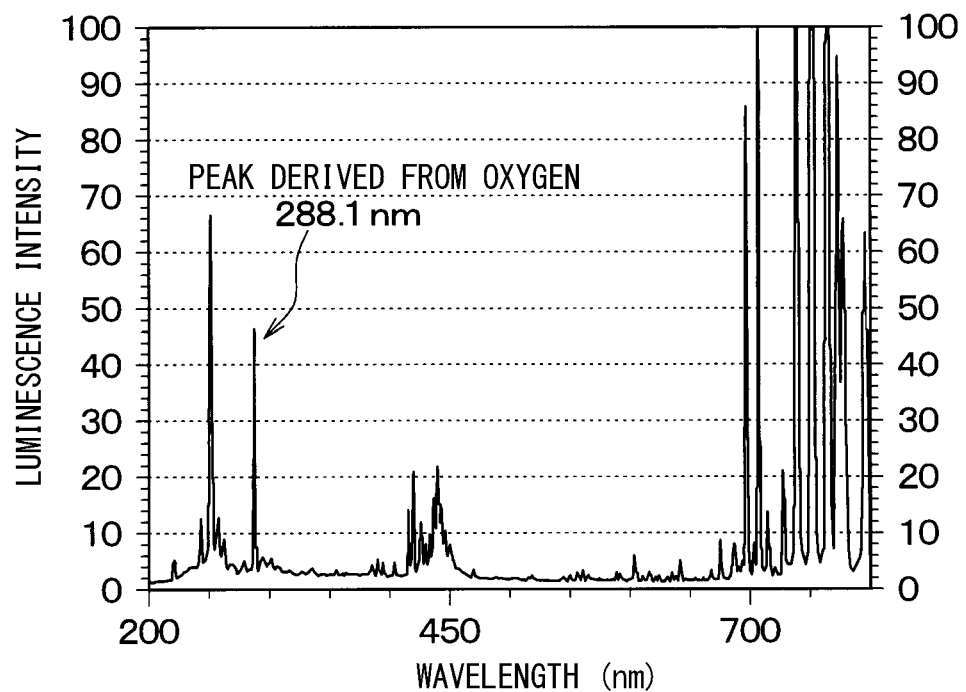
FIG. 5A is a diagram showing a result of plasma spectroscopic analysis when a silicon oxide film is removed by etching with respect to a structure in which a silicon oxide film is stacked on a silicon layer.
Figure 5B:
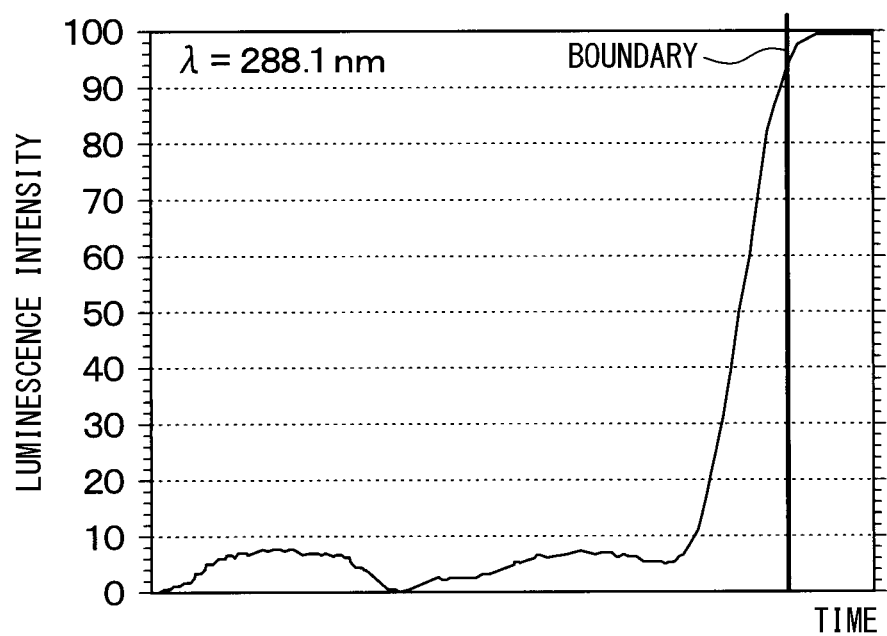
FIG. 5B is a diagram showing a change over time in emission intensity at a wavelength of 288.1 nm.

According to the experiment, as shown in FIG. 5A, for example, it is confirmed that a peak derived from an oxygen element appears at a wavelength of 288.1 nm. For this reason, as shown in FIG. 5B, it is possible to confirm the time change of the emission intensity at the wavelength of 288.1 nm, and to recognize the time when the emission intensity greatly changes as the interface between the silicon oxide film and the silicon layer. Thereby, it is possible to stop etching by detecting the interface of the stacked films made of different materials. Here, the plasma spectrometer 30 is only used for detecting the interface of the stacked films made of different materials, and is not used for detecting the interface of the stacked film of the same kind of semiconductor material.

On the other hand, the present inventors finds a feature such that the interface of the stacked films is detected by spectroscopic analysis using the plasma spectrometer 30 in a structure in which a plurality of different conductivity type layers are stacked, even when the stacked layers are made of the same kind of semiconductor material, and the etching stop operation is executed.

The present embodiment describes a structure in which a plurality of different conductivity type layers are stacked so that a p type base region 6 and an n type source region 8 are disposed on an n type current dispersion layer 5. In such a structure, when the interface between the p type base region 6 and the n type current dispersion layer 5 is detected, the etching stop is performed while forming the gate trench 11.

For example, nitrogen (i.e., N), which is an n type impurity, is introduced as an additive into the n type current dispersion layer 5 by 0.001%, and aluminum (i.e., Al) as a p type impurity is added to the p type base region 6 as an additive by 0.001%. Therefore, when the gate trench 11 is formed, a change in at least one of the n type impurity included in the n type current dispersion layer 5 or the p type impurity included in the p type base region 6 is monitored, so that these interfaces can be detected.

Figure 6A:
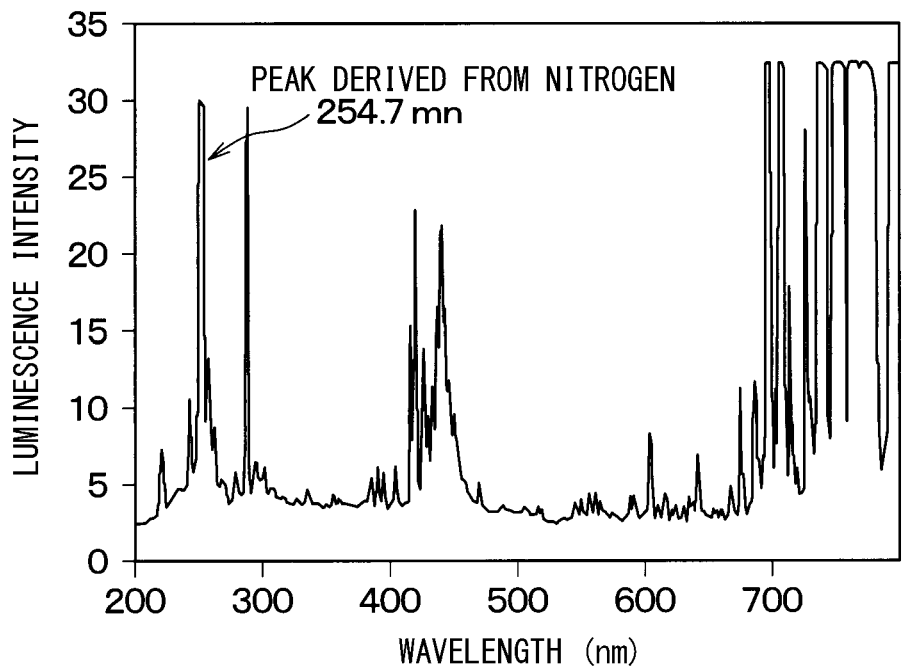
FIG. 6A is a diagram showing a plasma spectroscopic analysis result when an n type source region and a p type base region are removed by etching with respect to a stacked structure in which a p type base region and an n type source region are formed on an n type current dispersion layer.
Figure 6B:
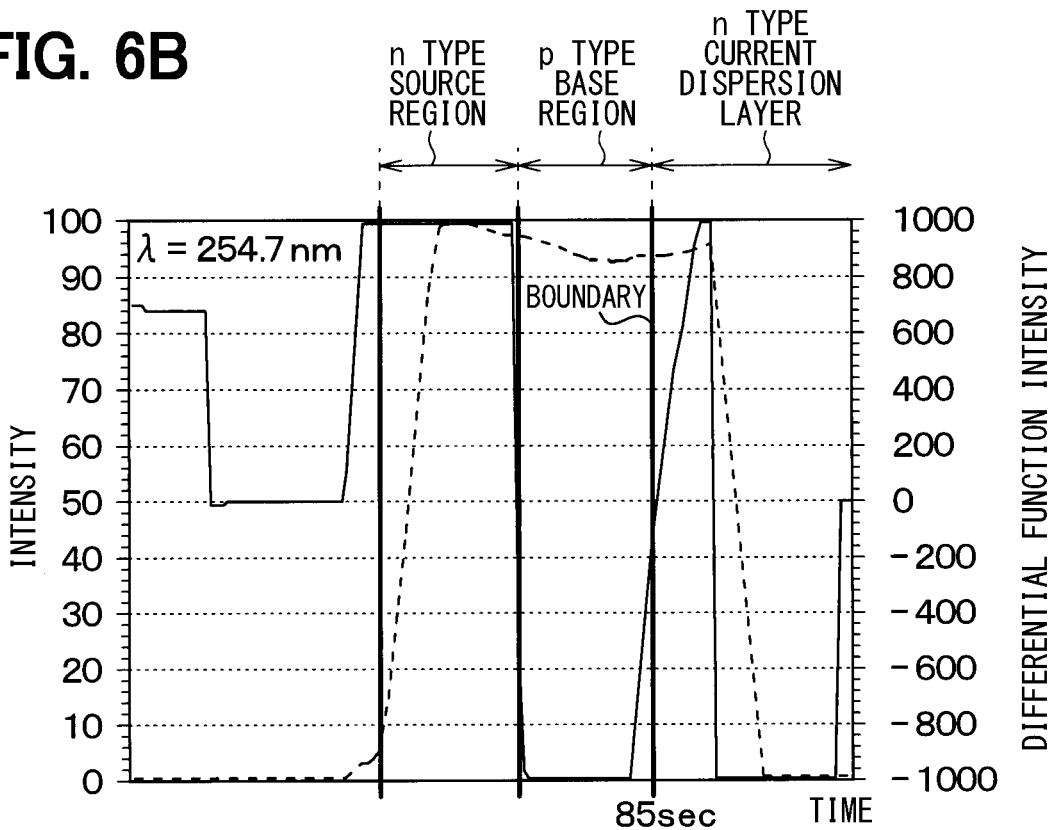
FIG. 6B is a diagram showing a change over time in emission intensity at a wavelength of 254.7 nm.

Specifically, when nitrogen is introduced into the n type current dispersion layer 5 as an n type impurity, the peak of nitrogen is confirmed by performing spectroscopic analysis with the plasma spectrometer 30. As a result, as shown in FIG. 6A, it is confirmed that a peak derived from a nitrogen element appears at a wavelength of 254.7 nm. For this reason, as shown in FIG. 6B, the time change of the emission intensity at the wavelength of 254.7 nm is confirmed, and the time when the emission intensity changes greatly is recognized as the interface between the p type base region 6 and the n type current dispersion layer 5. In FIG. 6B, in addition to the change in the emission intensity, the result of the differential function intensity, which is the differential value of the emission intensity for the wavelength of 254.7 nm, is also shown. The interface between the p type base region 6 and the n type current dispersion layer 5 is confirmed from the change in the emission intensity. Further, when the differential function intensity is obtained, the position where the temporal change in the emission intensity at the wavelength of 254.7 nm becomes larger is confirmed. Based on this, the interface between the p type base region 6 and the n type current dispersion layer 5 can be confirmed more accurately.

As described above, the temporal change from the n type impurity or the p type impurity or the temporal changes from both impurities included in the plasma are monitored based on the spectroscopic analysis by the plasma spectrometer 30, so that the interface between the p type base region 6 and the n type current dispersion layer 5 is confirmed. Thereby, the etching stop can be performed by detecting the interface of the stacked films made of different conductive type materials of the same kind of semiconductor material.

Therefore, in the present embodiment, since the interface between the p type base region 6 and the n type current dispersion layer 5 can be detected, the end point of the etching stop of the gate trench 11 can be accurately detected. That is, when it is requested to stop the etching of the gate trench 11 at a position where a predetermined protrusion amount is obtained from the interface between the p type base region 6 and the n type current dispersion layer 5 as in this embodiment, the interface is detected, so that the etching time from the detection of the interface may be controlled. Thereby, the end point of the etching stop of the gate trench 11 can be accurately detected, and the protrusion amount of the gate trench 11 from the p type base region 6 can be made constant with high accuracy. Therefore, MOSFET characteristics such as switching characteristics and breakdown voltage characteristics can be made uniform.

In this example, the wavelength of 254.7 nm is given as an example of the wavelength at which the change in emission intensity greatly appears. It is not always necessary to check the interface between the p type base region 6 and the n type current dispersion layer 5 based on the change in the emission intensity at the wavelength of 254.7 nm.

Figure 7A:
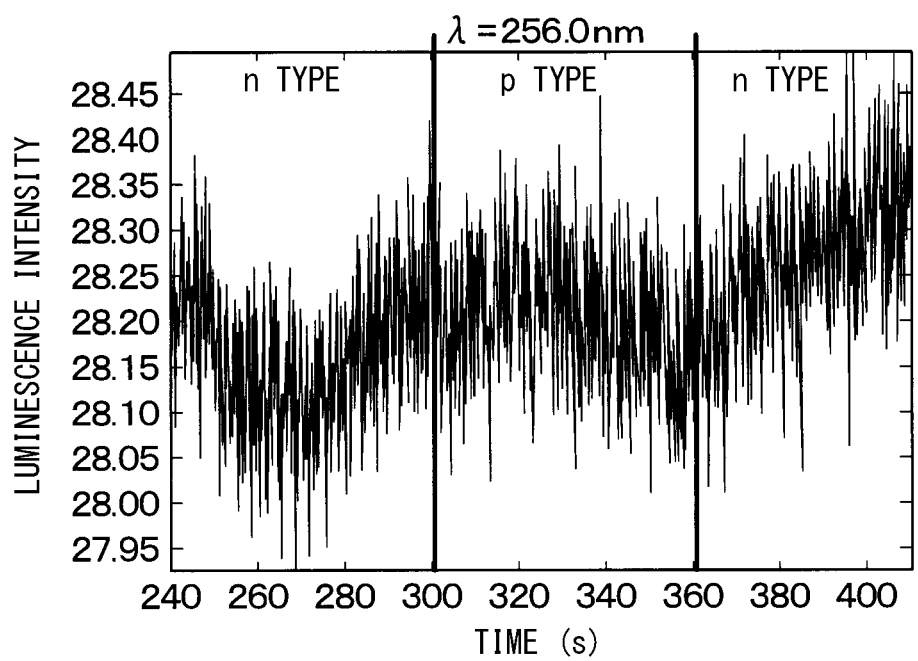
FIG. 7A is a diagram showing a change over time in emission intensity at a wavelength of 256.0 nm.
Figure 7B:
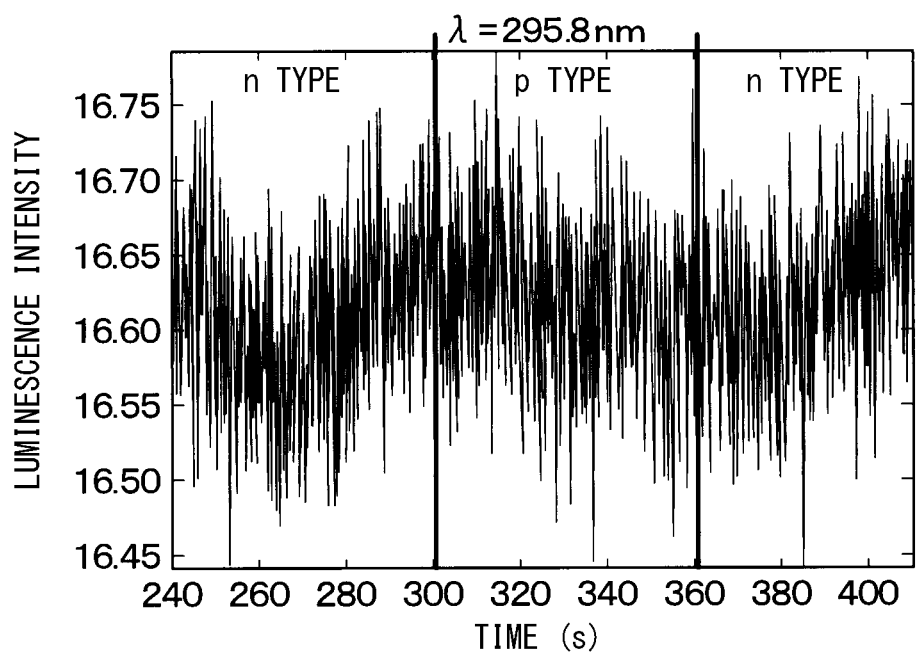
FIG. 7B is a diagram showing a change over time in emission intensity at a wavelength of 295.8 nm.
Figure 7C:
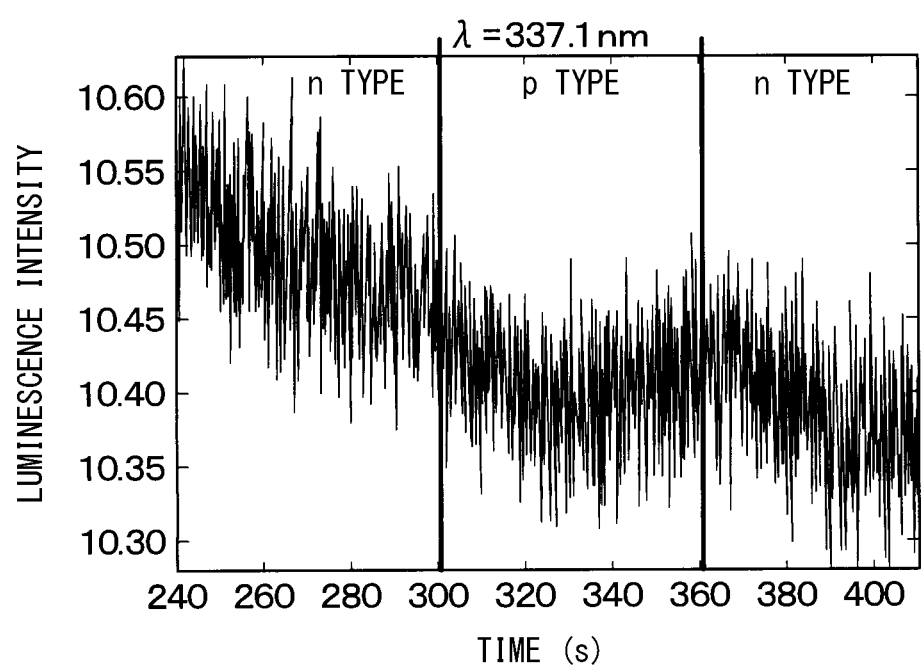
FIG. 7C is a diagram showing a change over time in emission intensity at a wavelength of 337.1 nm.

According to the experiment, in the NPN stacking structure in which the n type current dispersion layer 5, the p type base region 6 and the n type source region 8 are formed in this order as in this embodiment, the impurity concentration of each region or layer is set to be $1\times10^{17}/\text{cm}^3$ and the wavelength is changed so that the change of the emission intensity of nitrogen is investigated. Here, the wavelengths of 256.0 nm, 295.8 nm, and 337.1 nm are examined. As a result, as shown in FIGS. 7A to 7C, the emission intensity of nitrogen changes at the boundary between the p type layer and the n type layer in the NPN stacking structure at each wavelength. Thus, even when the wavelength is other than 254.7 nm, the change in the emission intensity of nitrogen can be examined, and the interface between the p type base region 6 and the n type current dispersion layer 5 can be confirmed. Specifically, when the wavelength of plasma spectroscopy is set in a range of at least a wavelength band between 200 nm and 1000 nm, the interface between the p type base region 6 and the n type current dispersion layer 5 is confirmed based on the change in the emission intensity of the additive.

Figure 3G:
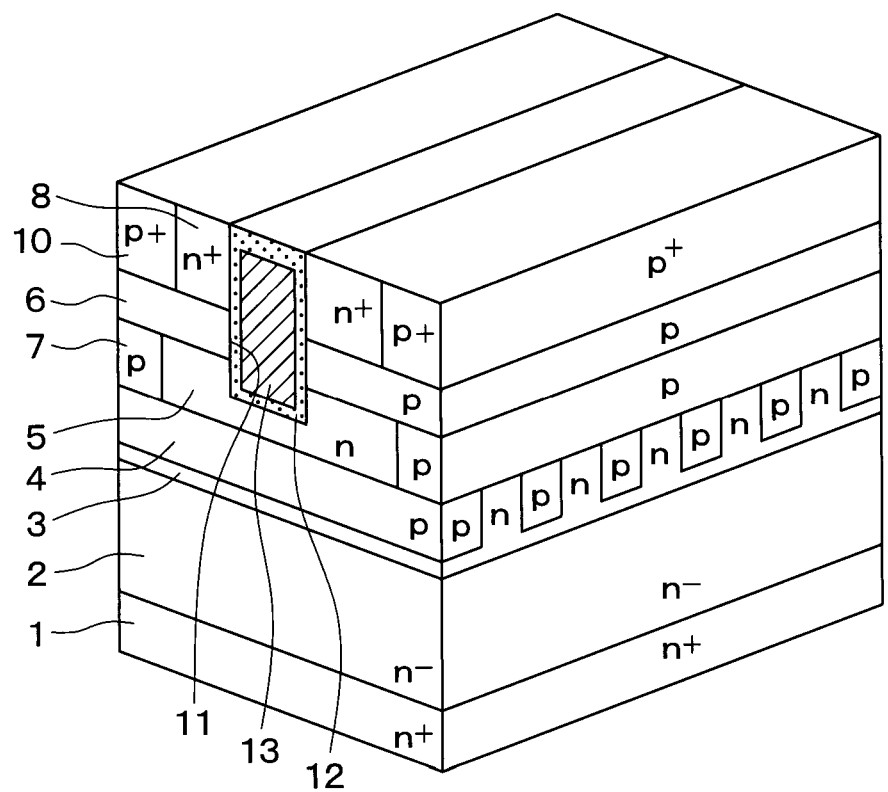
FIG. 3G is a perspective cross-sectional view showing a manufacturing process of the SiC semiconductor device continued from FIG. 3F.

[Process Shown in FIG. 3G]

After the mask is removed, the gate insulation film 12 is formed by performing thermal oxidation, so that the gate insulation film 12 covers the inner wall surface of the gate trench 11 and the surface of the n type source region 8. Then, after depositing Poly-Si doped with p type impurities or n type impurities, Poly-Si is etched back to remain at least Poly-Si in the gate trench 11 to form the gate electrode 13. Thereby, the trench gate structure is completed.

Although the subsequent steps are not shown, the following steps are performed. An interlayer insulation film 14 made of, for example, an oxide film or the like is formed to cover the surfaces of the gate electrode 13 and the gate insulation film 12. Further, a contact hole for exposing the n type source region 8 and the p type connection layer 10 is formed in the interlayer insulation film 14 using a mask (not shown). And after forming the electrode material comprised by the stacked structure made of multiple metals on the surface of the interlayer insulation film 14, the source electrode 15 and a gate wiring layer are formed by patterning the electrode material. Further, the drain electrode 16 is formed on the back surface side of the n$^+$ type substrate 1. In this way, the SiC semiconductor device according to the present embodiment is completed.

As described above, in the present embodiment, spectroscopy using wavelengths in the UV region to the visible region is performed by the plasma spectroscope 30, and the interface between several different conductivity type layers made of the same kind of semiconductor material is detected based on the change in light emission of the additive element during etching. Thus, since the interface can be detected, the end point of the etching stop of the gate trench 11 can be accurately detected. Therefore, it is possible to provide a method for manufacturing a semiconductor device with accurately detecting an interface between conductive type layers and performing the etching stop.

That is, when it is requested to stop the etching of the gate trench 11 at a position where a predetermined protrusion amount is obtained from the interface between the p type base region 6 and the n type current dispersion layer 5 as in this embodiment, the interface is detected, so that the etching time from the detection of the interface may be controlled. Thereby, the end point of the etching stop of the gate trench 11 can be accurately detected, and the protrusion amount of the gate trench 11 from the p type base region 6 can be made constant with high accuracy. Therefore, MOSFET characteristics such as switching characteristics and breakdown voltage characteristics can be made uniform.

Other Embodiments

The present disclosure is not limited to the above-described embodiment and may be suitably modified.

(1) For example, in the first embodiment, as an example of detecting the interface of a plurality of different conductivity type layers made of the same type of semiconductor material, an n channel inversion type vertical MOSFET is taken as an example. For this reason, the case where the etching stop of the gate trench 11 is detected by detecting the interface between the p type base region 6 and the n type current dispersion layer 5. Alternatively, any structure can be applied as long as the interface between the p type layer and the n type layer is detected and etching is stopped when forming the trench.

For example, when forming a guard ring in the outer peripheral region, a p type layer may be removed in the outer peripheral region to form a trench. In that case, the p type layer is removed and the n type layer is exposed. Therefore, as described in the first embodiment, the interface between the p type layer and the n type layer is detected so that the etching is accurately stopped, and the depth of the trench can be controlled with high accuracy.

Note that when detecting the interface between the p type layer and the n type layer, the impurity concentration introduced into the p type layer or the n type layer may be any. Preferably, at least one of layers may have a concentration of $1 \times 10^{16}/cm^3$ or more. This is because it is confirmed that when the impurity concentrations of both layers constituting the PN junction are both small, the change in the emission intensity is small and the detection accuracy of the interface is slightly lowered. Therefore, by setting the impurity concentration of at least one of the p type layer and the n type layer to be $1 \times 10^{16}/cm^3$ or more, it becomes possible to increase the change in emission intensity, and to ensure the detection accuracy of the interface.

The thicknesses of the p type layer and the n type layer may be also any. Both are preferably set to be 0.1 μm or more. This is because when the p type layer is 0.1 μm or less, the amount of additive included in the plasma during etching is small, and the change in emission intensity before and after removal is small. Further, assuming the upper limit value of the thickness of a semiconductor layer that is generally used, the change in the light emission is examined using the plasma spectrometer 30 when etching in a case where the thickness of each of the p type layer and the n type layer is 100 μm. In this case, the interface is detected. Therefore, when at least the thickness of the p type layer or the n type layer is 100 μm or less, the interface between the p type layer and the n type layer can be detected with high accuracy.

Figure 8A:
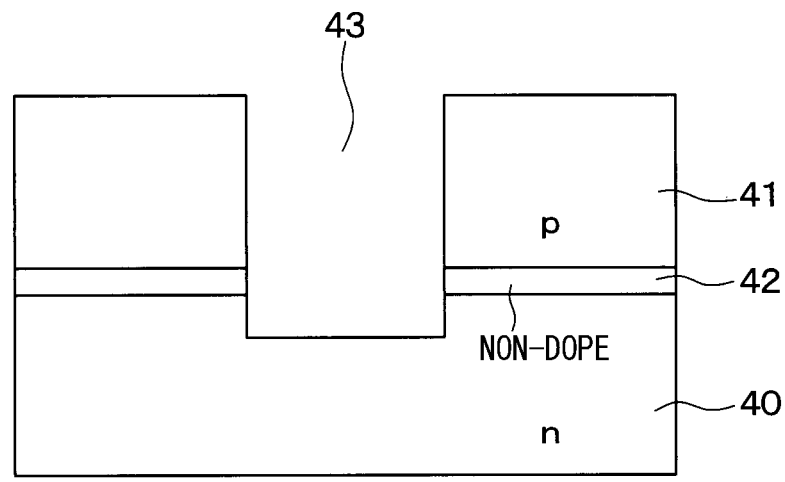
FIG. 8A is a cross-sectional view showing a structure including a non-doped layer in the case where both the p type layer and the n type layer described in another embodiment have a high concentration.

(2) As shown in FIG. 8A, when the impurity concentrations of the n type layer 40 and the p type layer 41 are both high concentrations of $1 \times 10^{17}/cm^3$ or more, it is preferable to arrange an undoped layer 42 made of the same kind of semiconductor material and including almost no impurities between the n type layer 40 and the p type layer 41. In this way, when the trench 43 is formed by etching, the change in the emission intensity due to the p type impurity becomes large at the interface between the p type layer 41 and the undoped layer 42, and the change in emission intensity due to the n type impurity becomes large at the interface between the undoped layer 42 and the n type layer 40. Therefore, even when the undoped layer 42 is disposed between the n type layer 40 and the p type layer 41, the interface between the n type layer 40 and the p type layer 41 can be accurately detected.

Although the undoped layer 42 is described as a layer including almost no impurities here, the concentration of n type impurities or p type impurities in the layer 42 may be $1 \times 10^{16}/cm^3$ or less. Further, although the thickness of the undoped layer 42 may be any value, since the layer 42 is a film inserted between the n type layer 40 and the p type layer 41, the thickness may be preferably 1.0 μm or less so as not to be too thick, and the thickness may be preferably 0.1 μm or more so that the change in emission intensity becomes large. Therefore, the undoped layer 42 has a thickness of 0.1 μm or more and 1.0 μm or less.

Figure 8B:
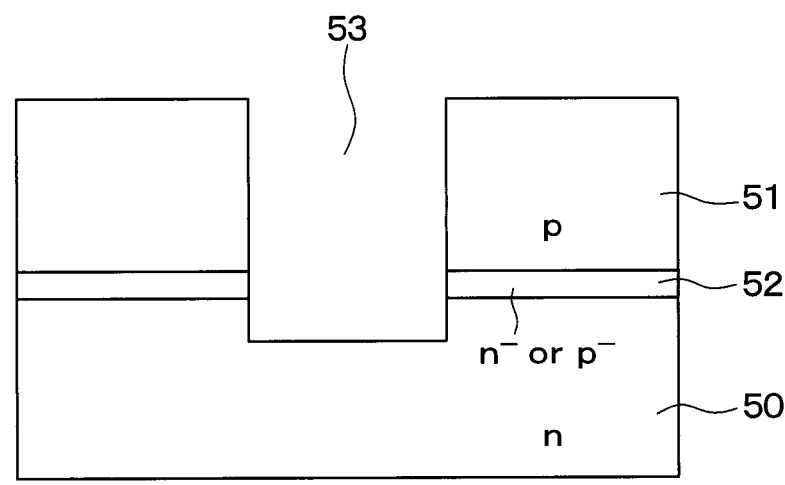
FIG. 8B is a cross-sectional view showing a structure including a high-concentration layer when both the p type layer and the n type layer described in another embodiment have a low concentration.

(3) As shown in FIG. 8B, when both the n type layer 50 and the p type layer 51 have low impurity concentrations of $1 \times 10^{16}/cm^3$ or less, a structure may include a high concentration layer 52 made of the same kind of semiconductor material, including impurities at a high concentration, and disposed between the n type layer 50 and the p type layer 51. In this way, when the trench 53 is formed by etching, the change in emission intensity due to the impurities included in the high concentration layer 52 becomes large at the interface between the p type layer 51 and the high concentration layer 52, and the change in emission intensity due to the impurities included in the high concentration layer 52 becomes large at the interface between the high concentration layer 52 and the n type layer 50. Therefore, even when the high concentration layer 52 is disposed between the n type layer 50 and the p type layer 51, the interface between the n type layer 50 and the p type layer 51 can be accurately detected.

Although the high concentration layer 52 is described as a layer including a high concentration of impurities here, the concentration of n type impurities or p type impurities in the layer 52 may be $1 \times 10^{17}/cm^3$ or more. Further, although the thickness of the high concentration layer 52 may be any value, since the layer 52 is a film inserted between the n type layer 50 and the p type layer 51, the thickness may be preferably 1.0 μm or less so as not to be too thick, and the thickness may be preferably 0.1 μm or more so that the change in emission intensity becomes large. Therefore, the high concentration layer 52 has a thickness of 0.1 μm or more and 1.0 μm or less.

(4) In addition, examples of various dimensions such as impurity concentration, thickness, width, and the like of each part constituting the SiC semiconductor device described in the above embodiments are merely examples.

(5) In the above-described embodiments, an n channel-type vertical MOSFET in which the first conductivity type is n type and the second conductivity type is p type has been described as an example. Alternatively, the conductivity type of each element may be reversed so as to form a p channel-type vertical MOSFET. In the above description, the vertical MOSFET is described as an example of a semiconductor element. Alternatively, the present disclosure may also be applied to an IGBT having a similar structure. In the case of an n-channel type IGBT, only the conductivity type of the n⁺ type substrate 1 is changed from the n type to the p type with respect to the above-described embodiments, and other structures and manufacturing methods are the same as those in the above-described embodiments.

(6) Although the semiconductor device using SiC as a semiconductor material has been described in the above embodiments, the present disclosure may be also applied to a semiconductor device using a semiconductor material other than SiC, for example, Si, Ge, C, etc., which are group IV semiconductors. Moreover, in the above embodiments, nitrogen is described as an example of an n type impurity, and aluminum is described as an example of a p type impurity. This is just an example. For example, phosphorus (P), which is a group 15, may be used as the n type impurity, and boron (B), which is a group 13, for example, may be used as the p type impurity.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A method for manufacturing a semiconductor device comprising:

preparing a stacking structure by forming a second conductive type layer over at least a first conductive type layer, by epitaxial growth, which is made of a same kind of semiconductor material as the second conductive type layer; and forming a trench by etching the second conductivity type layer by a plasma etching process to penetrate the second conductivity type layer and to expose the first conductivity type layer, wherein:

the etching of the second conductivity type layer by the plasma etching process includes performing a spectroscopic analysis of light emission of plasma generated in the plasma etching process using a plasma spectrometer;

the etching of the second conductivity type layer by the plasma etching process includes detecting an interface between the first conductivity type layer and the second conductivity type layer based on a change in emission intensity of at least one of an additive in the first conductivity type layer and another additive in the second conductivity type layer at a predetermined wavelength; and the etching of the second conductivity type layer by the plasma etching process includes stopping the etching of the second conductivity type layer when an end point is determined based on a detection result of the interface.

2. The method for manufacturing the semiconductor device according to claim 1, wherein:

the first conductivity type layer and the second conductivity type layer are made of a group IV semiconductor material.

3. The method for manufacturing the semiconductor device according to claim 1, wherein:

the first conductivity type layer and the second conductivity type layer have a thickness in a range between 0.1 μm and 100 μm.

4. The method for manufacturing the semiconductor device according to claim 1, wherein:

at least one of the first conductivity type layer and the second conductivity type layer has an impurity concentration of $1\times10^{16}/cm^3$ or more.

5. The method for manufacturing the semiconductor device according to claim 1, wherein:

both the first conductivity type layer and the second conductivity type layer have an impurity concentration of $1\times10^{17}/cm^3$ or more; and the method further comprising:

forming an undoped layer having a thickness of 0.1 μm or more and 1.0 μm or less and an impurity concentration of $1\times10^{16}/cm^3$ or less on the first conductivity type layer; and forming the second conductivity type layer on the undoped layer.

6. The method for manufacturing the semiconductor device according to claim 1, wherein:

both the first conductivity type layer and the second conductivity type layer have an impurity concentration of $1\times10^{16}/cm^3$ or less; and the method further comprising:

forming a high concentration layer having a thickness of 0.1 μm or more and 1.0 μm or less and an impurity concentration of $1\times10^{17}/cm^3$ or more on the first conductivity type layer; and forming the second conductivity type layer on the high concentration layer.

* * * * *